(12) United States Patent
Gherardi et al.

(10) Patent No.: US 6,272,730 B1
(45) Date of Patent: *Aug. 14, 2001

(54) PROCESS FOR PRODUCING A MULTIFILAMENTARY SUPERCONDUCTING TAPE

(75) Inventors: Laura Gherardi, Monza; Paola Caracino, Milan, both of (IT)

(73) Assignee: Pirelli Cavi S.p.A., Milan (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/653,435

(22) Filed: May 24, 1996

(30) Foreign Application Priority Data

Jun. 8, 1995 (IT) ................................. M195A1207

(51) Int. Cl.[7] ........................................ H01L 39/24
(52) U.S. Cl. ......................... 29/599; 174/125.1; 505/1; 505/430; 505/431
(58) Field of Search ............................. 29/599; 505/431, 505/430; 174/125.1

(56) References Cited

FOREIGN PATENT DOCUMENTS

| | | | |
|---|---|---|---|
| 0627773A | 1/1994 | (EP) | ............... H01L/39/14 |
| 405325667 A | * 12/1993 | (JP) | ...................... 505/431 |
| 406028930 A | * 2/1994 | (JP) | ...................... 505/431 |
| 406044842 A | * 2/1994 | (JP) | ...................... 505/431 |
| 406068729 A | * 3/1994 | (JP) | ...................... 505/431 |

OTHER PUBLICATIONS

Patent Abstracts of Japan—vol. 14, No. 573 Dec. 19, 1990.
Patent Abstracts of Japan—vol. 17, No. 460 Aug. 23, 1993.
Patent Abstracts of Japan—vol. 14, No. 205 Apr. 26, 1990.

* cited by examiner

*Primary Examiner*—Carl J. Arbes
(74) *Attorney, Agent, or Firm*—L. L. Brooks; Norris, Mc Laughlin & Marcus

(57) ABSTRACT

A process for producing a multifilamentary conductive tape of the type including a plurality of layers of a high-temperature superconducting material, incorporated in a mutually spaced relationship within a metal matrix, includes the steps of: a) submitting to plastic deformation individual metal tubes including a precursor of a superconducting material, so as to obtain a plurality of elementary tapes structurally independent from one another; b) coupling the tapes so obtained by means of a heat treatment at a temperature and for a time sufficient to establish a stable mutual connection between said tapes. The multifilamentary tape so obtained or possibly the independent tapes, are then subjected to at least one sintering step, which may be followed by one or more cycles of plastic deformation and sintering. Advantageously, the process of the invention allows to increase the fill factor of the tape, with a corresponding increase in the critical current in superconductivity conditions.

38 Claims, 1 Drawing Sheet

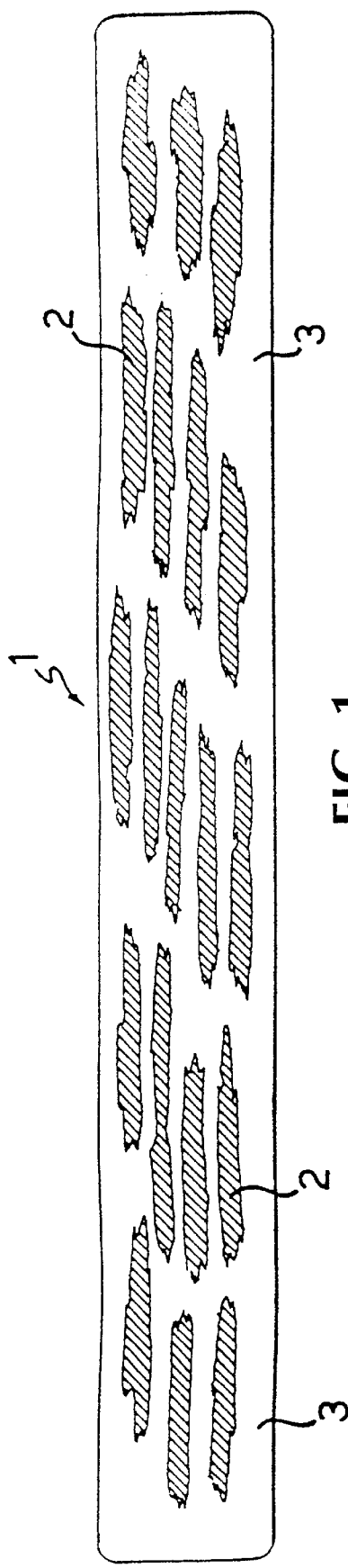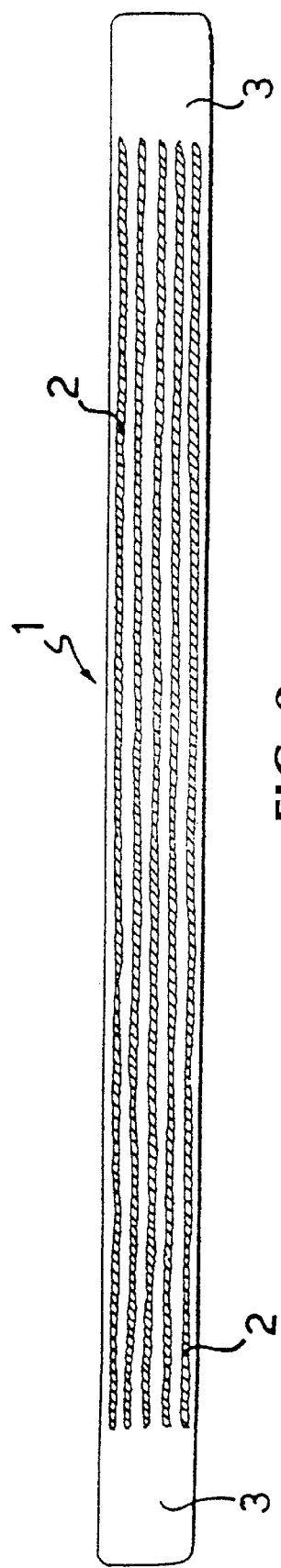
FIG. 1
PRIOR ART
FIG. 2

PROCESS FOR PRODUCING A MULTIFILAMENTARY SUPERCONDUCTING TAPE

In a general aspect, this invention relates to a process for producing a multifilamentary conductive tape of the type comprising a plurality of layers of a high-temperature superconducting material incorporated in mutually spaced relationship within a metal matrix.

More particularly, the invention relates to a process wherein a plurality of metal tubes, including a precursor of a superconducting material, are subjected to at least one plastic deformation step and at least one sintering step.

In the following description and in the subsequent claims, the term: high-temperature superconducting material, is used to indicate any material, such as for instance ceramics based on mixed oxides of copper, barium, yttrium or bismuth, lead, strontium, calcium, copper, thallium and mercury, comprising a superconducting phase having a substantially null resistivity at a temperature, defined as critical temperature or $T_c$, higher than 20° K (about −253° C.).

The term: precursor, is used to indicate in the following either any compound or mixture of compounds capable to form—subsequent to one or more heat treatments—a superconducting material as defined hereinabove, or a compound or mixture of compounds wherein the superconducting phase has already been formed.

Lastly, the term: electrically conductive element, is used to indicate in the following any element capable of carrying electric current, such as for instance cables or windings for magnet coils or for electric equipment in general.

As is known, in the field of electric power transmission, one of the more difficult problems to solve is that of making use of the so-called superconducting materials increasingly advantageously, either from a technological or from an economic point of view.

Although these materials are well known, in fact, their diffusion has been limited so far to some specific practical applications, such as for instance the manufacture of magnets for NMR apparatuses, for which cost is not a discriminating factor.

Actually, the cost savings due to the smaller power dissipated by the superconductor is so far more than counterbalanced by the costs of the refrigeration necessary to keep the superconductor below its critical temperature.

In order to solve the aforementioned problem, while part of the research has been oriented towards the experimentation for new superconducting materials, another part has attempted to improve either the characteristics of the existing materials, or the performances of the conductors incorporating the materials presently available.

As to the geometric characteristics of the conductors, it has been observed, for instance, that the optimal geometry is that of the thin tape having a thickness of from 0.05 to 1 mm.

In this case, in fact, the conductor including the ceramic superconductor—which is known to be very fragile—achieves on the one hand an improved resistance against the various mechanical bending stresses to which it undergoes during all the operations connected to the manufacture, handling and installation of the cable containing the same, and, on the other hand, achieves better performances as to its critical current density, because of the more favourable orientation and compactness degree of the superconducting material.

For various reasons and in particular to achieve a still greater mechanical resistance, the above conductors are generally constituted by a plurality of tapes, each formed by a core of superconducting material enclosed in a metal casing, generally silver or silver alloys, coupled to one another to produce a multifilamentary composite structure.

According to the prevailing methodology, known in the art under the term: "powder-in-tube", this multifilamentary composite structure is obtained starting from a plurality of metal tubes filled with a suitable powder precursor, which are enclosed in their turn in another external metal tube or a billet, so as to obtain a compact bundle of tubes which undergo several subsequent plastic deformation treatments, of extrusion and/or drawing first and then of rolling and/or pressing, until the desired tape-shaped structure is obtained.

Between a rolling treatment and the following one, the tape being processed is subjected to one or more heat treatments, in order to promote the formation of the superconducting ceramic material starting from its precursor and, above all, to promote its sintering, i.e. the mutual "welding" of the grains of the superconductor powder.

The need of incorporating the superconducting material into a plurality of metal tubes, and, especially, the need of enclosing the latter in an external casing in order to carry out the above-identified plastic deformation and sintering treatments on the multifilamentary composite structure, however, limit to a large extent the overall quantity of superconducting material that can be incorporated in a tape, with a corresponding limitation of the maximum current density achievable in conditions of superconductivity or technical critical current density "$J_e$", defined as the ratio between the critical current and the total cross section of the multifilamentary composite structure.

The technical problem underlying the present invention is therefore to provide a multifilamentary conductive tape, useable, for instance, as a superconducting element within a cable, which tape shows an improved technical critical current density $J_e$ using the same quantity of superconducting material.

According to a first aspect thereof, the present invention therefore relates to a process for producing a superconducting multifilamentary tape of the aforementioned type, which is characterized in that said plastic deformation step is carried out on each individual tube of said plurality of tubes, so as to obtain a corresponding plurality of elementary tapes, structurally independent from one another, and in that it comprises at least a coupling step of said elementary tapes, including a heat treatment at a temperature and for a time sufficient to cause a stable mutual connection between said tapes.

According to the invention, in fact, it has surprisingly been observed that a tape having the required multifilamentary structure may be obtained—without using any external containing casing—by submitting each tube, filled with superconducting material or a precursor thereof, to a first plastic deformation treatment, so as to obtain a plurality of structurally independent elementary tapes which are then irreversibly coupled and welded to one another by means of a heat treatment at a temperature and for a time sufficient to cause a stable mutual connection thereof.

In contrast to the constant teaching of the prior art, in fact, it has been observed that, even without the use of any external containing casing, such heat treatment allows to weld the tapes to one another so effectively that all the following plastic deformation and/or sintering treatments, as well as all the subsequent operations carried out on the multifilamentary tape may be performed without any problem of separation or mutual sliding of the individual starting tapes.

According to the invention, it has been noticed that—when the metal matrix is constituted by silver or silver alloys—optimum adhesion characteristics between the tapes incorporating the superconducting material or a precursor thereof may be achieved when the tapes—stacked, arranged side by side or anyhow in contact with one another—are subjected to a heat treatment at a temperature of not less than 600° C. for a time of not less than 50 hours.

According to a preferred embodiment, the tapes incorporate a precursor of the chosen superconducting material, and the step of coupling the tapes is advantageously performed simultaneously with one of the sintering steps necessary to promote the growth of the oriented crystalline structure of the final superconducting material.

It has been observed, in fact, that the temperature and the time necessary to carry out sintering of the precursor may ensure those minimum values necessary to obtain an adequate adhesion between the tapes.

For the purposes of the invention, at least a sintering step is carried out at a temperature of at least 750° C. for at least 10 hours and in a controlled atmosphere comprising at least 1% v/v of oxygen.

Such conditions, in fact, promote the formation of the superconducting ceramic material, starting from its precursor and especially the mutual "welding" of the superconductor powder grains.

As superconducting materials, those materials may be used that are indicated in the field by the acronym BSCCO, having the formula:

$$Bi_\alpha Pb_\beta Sr_\gamma Ca_\delta Cu_\epsilon O_x \quad (I)$$

wherein:

$\alpha$ is a number of from 1.4 to 2.0; $\beta$ is a number of from 0 to 0.6; $\gamma$ is a number of from 1.5 to 2.5; $\delta$ is a number of from 0 to 2.5; $\epsilon$ is a number of from 1.0 to 4.0; x is the stoichiometric value corresponding to the different oxides present.

In particular, in the case of the material indicated as BSCCO-2223 having the ideal formula $(BiPb)_2Sr_2Ca_2Cu_3O_x$, the sintering step is preferably carried out at a temperature of from 820 to 835° C. and for 25 to 150 hours according to the type of precursor used, using known ovens well temperature-stabilized and in an atmosphere comprising 5 to 10% v/v of oxygen.

On the other hand, if the precursor is essentially constituted by or anyhow comprises one or more compounds whose superconducting phase is already formed in part, the sintering step promotes a further growth as well as a mutual "welding" of the grains of the superconducting phase.

According to a further embodiment of the invention, the coupling step of the tapes incorporating the precursor of the superconducting material may be performed before carrying out the first of the precursor sintering steps.

In such a case, the coupling step of the tapes of superconducting material is preferably carried out at a temperature of from 600 to 700° C.

Using temperatures exceeding 700° C., in fact, it has been found that alteration phenomena of the superconducting material may begin to appear, with the irreversible formation of undesired solid phases and an ensuing degradation of the current transmission properties.

In this way, a tape is obtained having a multifilamentary or, better, a multilayered structure incorporating a plurality of layers, either of a partly formed superconducting material in the first case or of a precursor in the second case, incorporated in a mutually spaced relationship within a metal matrix.

According to the invention, the multifilamentary tape so obtained is preferably subjected to several subsequent sintering and plastic deformation treatments, so as to promote the growth of the crystalline structure of the superconducting material and, at the same time, to improve the orientation and densification of the so obtained superconductor.

Obviously, in the above preferred embodiment—in which the coupling step of the tapes incorporating the precursor of the superconducting material and the first sintering step are carried out simultaneously—it will be advantageously possible to proceed directly to a plastic deformation step.

If the sintering and coupling steps of the tapes are performed separately, the multifilamentary tape may be subjected to sintering first and then to plastic deformation or vice versa, without any perceptible variation in the results.

According to the invention, in fact, it has been observed that the sequence of the steps is not critical for achieving a multifilamentary superconducting tape having the required characteristics.

The process of the invention preferably comprises two sintering steps, each performed according to the process parameters indicated above, staggered by at least a plastic deformation step.

Besides, the plastic deformation steps are preferably carried out by rolling with known apparatuses.

According to a further embodiment of the invention, the coupling step of the tapes may be carried out after each individual tape has been subjected to the necessary sintering and plastic deformation treatments needed to promote the growth of the crystalline structure of the superconducting material and, respectively, to improve the orientation and the density of the superconductor so obtained.

Advantageously, the coupling steps of the tapes may be carried out simultaneously with the last of the sintering treatments, having already superposed or arranged side by side several tapes.

In the alternative, the coupling step of the tapes may be carried out after the last of the sintering treatments at a temperature of from 600 to 700° C.

According to the invention, it is also possible to couple groups of tapes together, obtaining respective semi-finished products, submit the semi-finished products so obtained to plastic deformation and then couple said groups to one another simultaneously with one of the intermediate sintering treatments, so as to obtain the final multifilamentary tape.

In a preferred embodiment, the number of tubes to be independently subjected to plastic deformation may be from 2 to 9, so as to obtain a corresponding number of superconducting material layers—precisely 2 to 9 —in the final multifilamentary tape.

Still more preferably, the number of tubes independently subjected to plastic deformation is equal to 5.

For the purposes of the invention, the superconducting material is chosen among the group comprising: bismuth, lead, barium, yttrium, strontium, calcium, thallium and mercury.

A preferred example of superconducting material is a mixed copper-bismuth-lead-strontium-calcium oxide of the family referred to with the name: BSSCO and having the aforementioned formula (I).

Among the latter, the mixed oxides having the following ideal general formula are preferred:

$$(BiPb)_2Sr_2Ca_{n-1}Cu_nO_x$$

wherein n is a whole number of from 1 to 3 and x is the stoichiometric value corresponding to the different oxides present.

Among these, particularly advantageous results have been obtained with the mixed oxide referred to with the name BSSCO-2223 (i.e., wherein n=3), or with suitable mixtures of mixed oxides of the above metals, in such ratios as to obtain a mean stoichiometry in the mixtures corresponding to that of the BSSCO-2223 oxide.

For the purposes of the invention, furthermore, the metal of the tubes which forms the metal matrix of the multifilamentary tape comprises a metal selected from the group comprising: silver, silver alloys, copper and steel.

The metal matrix of the multifilamentary tape may possibly comprise two or more layers of said metals.

Preferably, the metal used is silver, possibly reinforced with a suitable "doping" obtained by adding thereto elements such as magnesium, copper, nickel or titanium.

According to a further aspect of the invention, the above-identified process provides a multifilamentary conductive tape comprising a plurality of layers of a high-temperature superconducting material incorporated in mutually spaced relationship within a metal matrix, which material is particularly suitable for manufacturing conductors for cables to be used in the so-called power transmission.

According to the invention, the above multifilamentary tape is characterized in that it has a fill factor, defined by the ratio between the cross-section filled by the superconductor and the overall cross section of the tape, not smaller than 25%.

The fill factor is preferably not smaller than 33%.

Thanks to the above high value of the fill factor, the multifilamentary tape of the invention allows to reach—using the same quantity and quality of the superconducting material—a technical critical density greater than that which may be obtained with the tapes of the known art.

According to a further aspect of this invention, the multifilamentary tape comprises a plurality of layers of high-temperature superconducting material incorporated in mutually spaced relationship within a metal matrix and superimposed throughout substantially the whole cross-section of said multifilamentary tape.

Besides, said layers of superconducting material are advantageously extended along substantially the whole cross-section of said tape.

Thanks to these structural features, the multifilamentary tape object of the invention achieves the desired and improved fill factor, and, along therewith, a technical critical current density greater than that which may be obtained by the tapes of the known art.

According to a further aspect thereof, the invention also refers to an electrically conductive element comprising a multifilamentary tape as described above.

According to an embodiment of the invention, said electrically conductive element may be a cable and in particular a cable to be used for the so-called power transmission.

Thanks to the above high fill factor value of the multifilamentary superconducting tape, the cable of the invention advantageously shows—as compared to the ones of known type—an increased power transmission capacity with the same size, or a smaller size with the same transmitted power.

In an alternative embodiment, the electrically conductive element of the invention may be a winding for magnet coils or electric equipments.

Further characteristics and advantages will be better apparent by the following description of some examples of the process for preparing multifilamentary tapes according to the invention.

The following examples are given by way of non limitative illustration with reference to the attached drawings wherein:

FIG. 1 shows a schematic cross-section of a multifilamentary tape according to the prior art;

FIG. 2 shows a schematic cross-section of a multifilamentary tape according to the invention.

With reference to the above figures, a multifilamentary tape 1 comprises a plurality of layers of a superconducting material, all indicated by 2, incorporated in mutually spaced relationship within a metal matrix 3, for instance a silver one.

FIGS. 1 and 2 show respectively a multifilamentary tape incorporating a superconducting material obtained according to the prior art (19 filaments arranged on 5 layers) and, according to the invention (5 filaments and layers).

In the following examples, some examples of how the process according to the invention may be carried out will be now given by way of non-limitative indication.

EXAMPLE 1

A silver tube having inner and outer diameter equal to about 5.5 mm and, respectively, to about 8.5 mm and a length of about 10 cm, was filled with a precursor constituted by a mixture of mixed bismuth-lead-strontium-calcium-copper oxides, having the following mean composition: $Bi_{1.8}Pb_{0.4}Sr_{2.0}Ca_{2.2}Cu_{3.0}O_x$, wherein x=10±1, and was subsequently deformed in a drawbench, using circular dies and performing many passes to gradually reduce the tube diameter down to about 2 mm.

The resulting tube was then rolled in a rolling mill, so as to obtain, in this case as well by means of several rolling passes, a tape having a length of about 3 m, a thickness of about 0.1 mm and a width of 4 mm.

Such tape, incorporating the aforementioned precursor in a silver matrix, showed a fill factor of about 37%.

Two samples of the length of 6 cm each, obtained from the above tape, were then stacked and introduced in a tubular oven where they were submitted, in a controlled atmosphere comprising 8% v/v of $O_2$, to a sintering treatment at a temperature of 820° C. for 50 hours.

A third sample of the length of 6 cm, obtained from the same tape, was placed near the two previous samples and contemporaneously subjected to the same heat treatment in the same oven.

During such treatment, a simultaneous coupling step of the stacked tapes took place, producing a compact multilayered structure incorporating two layers of partly formed superconducting material, having a fill factor of about 37%.

Both the multifilamentary tape so obtained and the single tape sample were then subjected to repeated rolling passes, operating progressive thickness reductions, equal to about 10% per pass, in order to improve the orientation and the density of the superconducting material formed in the previous step.

In this way, a two-layer tape sample having a thickness of about 170 micron and a one-layer tape sample about 90 micron thick were obtained, which were then subjected to a second sintering treatment in the same conditions and within the same apparatus mentioned hereinabove, but for an overall time of 120 hours.

Bifilamentary and monofilamentary tapes were obtained, having the following characteristics:

|  | bifilamentary | monofilamentary |
| --- | --- | --- |
| length: | 7 cm | 7 cm |
| width: | 3.5 mm | 3.5 mm |
| thickness: | 0.17 mm | 0.09 mm |
| fill factor: | 37% | 37% |

Both the technical critical current density (current density in conditions of superconductivity) and the critical current values, were then measured on these tapes using the so-called "four-contact method", according to the specifications of the IEC 90125/CD standards, selecting an "electric field" criterion of 100 microV/m.

The bifilamentary tape showed a technical critical current density of about 2,220 A/cm$^2$ and a critical current of about 9.9 A, comparable with the technical critical current density measured on the monofilamentary tape, of 2,200 A/cm$^2$, to which corresponded a critical current of about 4.89 A.

EXAMPLES 2–4

According to the procedure described in the preceding Example 1, multifilamentary tapes were prepared starting respectively from 2, 3 and 5 plastically deformed monofilamentary small tapes with a fill factor of 33%.

However, in this case the first step of simultaneous sintering and coupling of the individual tapes was carried out by inserting the tapes arranged side by side into a slit, having a depth of 8 mm, a width of 0.8 mm and a length of 100 mm, obtained in a supporting refractory plate.

The tapes, supported in vertical position, were welded to one another just in the same way as happened for the stacked tapes of the preceding Example 1.

Also in this case, the multifilamentary tapes so obtained, including respectively 2, 3 and 5 layers of partly formed superconducting material, were subjected to a further rolling and sintering step.

In this way, respective multifilamentary tapes were obtained on which measurements either of the technical critical current density or of the critical current were carried out according to the procedure explained in the preceding Example 1.

The geometric characteristics of the tested tapes and the results of the aforementioned measurements are shown in Table I hereunder.

TABLE I

| Characteristic | Ex. 2 | Ex. 3 | Ex. 4 |
| --- | --- | --- | --- |
| length (cm) | 7.5 | 6.5 | 6 |
| width (mm) | 3.5 | 3.5 | 3.5 |
| thickness (mm) | 0.17 | 0.20 | 0.24 |
| fill factor (%) | 33 | 33 | 33 |
| $J_c$ (A/cm2) | 1,815 | 1,650 | 1,650 |
| critical current (A) | 14.4 | 15.4 | 18.5 |

$J_c$ technical critical current density

EXAMPLE 5

Two silver tubes having an outer diameter of about 8.5 mm, a wall thickness of 1.5 mm and a length of about 10 cm, were filled with the same precursor and subsequently drawn and rolled according to the procedure of the preceding Example 1.

In this way, two tapes were obtained having a thickness of 0.1 mm, a width of 3.4 mm and a length of 60 cm, incorporating the above precursor in a silver matrix and having a fill factor of about 37%.

Said tapes were spiral-wound around a cylindrical mandrel having a diameter of about 50 mm, externally provided with a 1 mm-deep and 5 mm-wide helical groove.

More particularly, the tapes were wound around one another with a slight pre-tensioning (smaller than 500 g).

The mandrel with the tapes so wound was then inserted into a tubular oven, wherein a first sintering step was carried out.

Even if the thermal expansion of the mandrel was about 6 times lower than that of the tapes, which turned out to be loose at high temperature, the coupling of the latter was similar to that obtained in the preceding examples.

The bifilamentary tape obtained was then rolled again, without any decohesion problems between the coupled layers, and subsequently heat re-treated in the same conditions and with the same procedure of the preceding Example 1.

A compact bifilamentary tape was obtained, having a thickness of 0.18 mm, a width of 3.5 mm and a length of 54 cm, which showed, upon analysis carried out according to the procedures illustrated in the preceding Example 1, a technical critical current density of about 1,110 A/cm$^2$, as well as a critical current of about 5.8 A.

EXAMPLE 6

A silver tube having a diameter of about 8.5 mm, a wall thickness of about 1.1 mm and a length of about 10 cm, was filled with the same precursor powder of the preceding Example 1 and subjected to drawing and rolling.

Four parts of the same length equal to about 25 cm were cut from the tape.

The four tapes so obtained were then coupled two by two, forming two couples of tapes which were then separately subjected to respective sintering treatments at 820° C. for 50 hours in an atmosphere containing about 8% v/v of oxygen, with simultaneous coupling, according to the procedure explained in the preceding Example 1.

Two bifilamentary tapes were obtained, incorporating each of the two layers of partly formed superconducting material, which were separately subjected to rolling, so as to form tapes having a thickness of 0.17 mm, a width of 3.5 mm, a length of 24 cm and a fill factor of about 35%.

The two bifilamentary tapes so obtained were then stacked and subjected together to a second sintering treatment at a temperature of 820° C., for 50 hours and in a controlled atmosphere comprising 8% v/v of $O_2$.

During such treatment, a simultaneous coupling step of the bifilamentary tapes took place, which produced a compact multilayered structure incorporating four layers of partly formed superconducting material, having a fill factor of about 35%.

The multifilamentary tape so obtained was then subjected to a second rolling treatment and to a third and last sintering step according to the same procedure previously indicated.

A compact multifilamentary tape was obtained, which showed, upon analysis carried out according to the procedure explained in the preceding Example 1, a technical critical current density of about 1,085 A/cm$^2$, as well as a critical current equal to about 9 A.

In order to compare the performances obtainable from a multifilamentary tape according to the invention with those of the prior art, multifilamentary reference tapes were prepared according to the the following Examples 7–10.

EXAMPLE 7

Prior Art

A multifilamentary tape according to the prior art was obtained by inserting—inside a containing tube—19 silver tubes of hexagonal section, obtained by drawing with an hexagonal die-plate round filaments of a diameter of about 1.4 mm, each filled with the precursor of the preceding Example 1.

The cross section of each hexagonal-section tube was about 1.27 mm$^2$.

The tube used had the following geometric characteristics:

| | |
|---|---|
| outer diameter: | 8.5 mm |
| inner diameter: | 6.5 mm |

The tube including in its inside the 19 tubes was then repeatedly die-drawn, with a progressive section reduction not greater than 10%, to obtain a cylindrical multifilamentary structure having an outer diameter of about 1.8 mm, which structure was then subjected to rolling, according to a procedure similar to that explained hereinabove, until a multifilamentary tape was obtained having a thickness of 0.23 mm, a width of 4 mm and a fill factor of about 19%.

A 10 cm long sample of the multifilamentary tape so obtained was then inserted into a tubular oven where it was subjected, in a controlled atmosphere comprising 8% v/v of $O_2$, to a first sintering treatment at a temperature of 820° C., for 50 hours.

The tape was then subjected to a rolling pass, to obtain a thickness reduction of about 10%, in order to improve the orientation and density of the superconducting material formed in the preceding step.

The tape so obtained was lastly subjected to a second sintering treatment in the same conditions and with the same apparatuses as described above, but for an overall time of 120 hours.

Such treatments did not substantially alter the aforementioned size parameters. The sample, in fact, showed the following geometric characteristics:

| | |
|---|---|
| thickness: | 0.2 mm |
| width: | 4 mm |
| length: | 11.5 cm |

On the multifilamentary tape of known type so obtained measurements were then carried out either of the technical critical current density, or of the critical current, according to the procedure illustrated in the preceding Example 1, with the following results:

| | |
|---|---|
| technical critical current density: | 665 A/cm$^2$ |
| critical current: | 5.3 A |

EXAMPLE 8

Invention

A second multifilamentary tape was obtained starting from 5 silver tubes having a diameter of 1.4 mm, quite identical to those of the preceding example, which tubes were independently subjected to rolling and then subjected together to the sintering treatments with simultaneous coupling and to the intermediate rolling as described in Example 1.

In this case, at the end of the process, a multifilamentary tape was obtained having the following geometric characteristics:

| | |
|---|---|
| thickness: | 0.2 mm |
| width: | 3.8 mm |
| length: | 10 cm |

The fill factor of the tape was equal to about 37%.

Measurements were then carried out on the so obtained multifilamentary tape either of the technical critical current density, or of the critical current, according to the procedure illustrated in the preceding Example 1, with the following results:

| | |
|---|---|
| technical critical current density: | 1,110 A/cm$^2$ |
| critical current: | 8.4 A |

Thanks to the increased value of the fill factor, the multifilamentary tape of the invention showed values of technical critical current density and of the critical current greater than those achievable with the multifilamentary tape of Example 7.

EXAMPLE 9

Prior Art 61 tubes having hexagonal cross-section equal to those of the preceding Example 7 were inserted within a tube having an outer diameter of 13.5 mm and an inner diameter of 11.5 mm.

The tube so obtained was then deformed according to the same procedure of Example 7, obtaining a multifilamentary tape having a width of 4.2 mm, a thickness of 0.25 mm and a fill factor of about 25%.

This multifilamentary tape of known type allowed to reach a critical current of about 7.1 A.

EXAMPLE 10

Invention

A second multifilamentary reference tape was obtained according to the process of the invention illustrated in the preceding Example 1, starting from 9 tubes just identical to those of the preceding Example 7.

This multifilamentary reference tape showed a length of 4 mm, a thickness of 0.25 mm and a fill factor of 37%.

The multifilamentary tape of the invention showed a critical current of about 10 A, greater than that achievable with the multifilamentary tape according to the prior art of the preceding Example 9.

The data of the preceding comparative Examples 7–10 show that the invention allows to obtain multifilamentary tapes having a fill factor of about 37%, definitely greater than the 19% and 25% values found in the tapes according to the prior art, with an increase in the technical critical current density of at least 40%.

The numerous advantages achieved by the process of the invention, furthermore, clearly appear from what has been described and illustrated hereinabove.

Among them, the following ones may be mentioned:

possibility of substantially increasing the fill factor of the multifilamentary tape, to the full advantage of the current transportable in conditions of superconductivity with the same section of the tape;

extreme operating flexibility;

possibility of using manufacturing equipment known in the art and already available to the technicians of this field, with advantageous cost savings.

Besides, the multifilamentary tape of the invention shows a greater thickness uniformity throughout its cross section, as well as a more homogenous deformation degree of the zones filled by the superconducting material along its length.

Obviously, those skilled in the art may introduce variants and modifications to the above described invention, in order to satisfy specific and contingent requirements, variants and modifications which fall anyhow within the scope of protection as is defined in the following claims.

What is claimed is:

1. Process for producing a multifilamentary conductive tape of the type comprising a plurality of layers of a high-temperature superconducting material, incorporated in mutually spaced relationship within a metal matrix, said process comprising:
   a) at least a first plastic deformation step of a plurality of metal tubes including a precursor of a superconducting material, said plastic deformation step being carried out on each individual tube of said plurality so as to obtain a corresponding plurality of elementary tapes, structurally independent from one another;
   b) at least a first sintering step of said precursor for promoting the growth of a crystalline structure of the superconducting material;
   c) placing a plurality of said elementary, structurally independent tapes into contact with one another; and
   d) coupling the contacting but structurally independent tapes to adjacent tapes with a stable mutual connection by subjecting said contacting elementary tapes to at least one heating in a heated atmosphere, the temperature of the heating and the time duration of the heating being sufficient to cause such stable mutual connection.

2. Process according to claim 1, wherein said heat treatment coupling step of the contacting elementary tapes is carried out at a temperature of at least 600° C. and for a time not less than 50 hours.

3. Process according to claim 1, wherein the coupling step of said contacting elementary tapes incorporating the precursor of the superconducting material is carried out simultaneously with said first sintering step of the precursor.

4. Process according to claim 1, wherein said first sintering step is carried out subsequent to the coupling step of said contacting elementary tapes.

5. Process according to claim 4, wherein the coupling step of said elementary tapes is carried out at a temperature of from 600° to 700° C.

6. Process according to claim 1, wherein said first plastic deformation step and said first sintering step are carried out on each of said structurally independent elementary tapes before carrying out the coupling of the contacting elementary tapes.

7. Process according to claim 1, wherein said first sintering step is carried out at a temperature of at least 750° C. for at least 10 hours and in an atmosphere comprising at least 1% v/v of oxygen.

8. Process according to claim 1, further comprising at least two sintering steps of said elementary tapes.

9. Process according to claim 1, wherein the precursor of said superconducting material is selected from mixed oxides of copper and one or more metals selected from the group comprising: barium, yttrium, bismuth, lead, strontium, calcium, thallium and mercury.

10. Process according to claim 9, wherein said superconducting material has the following formula:

$$Bi_\alpha Pb_\beta Sr_\gamma Ca_\delta Cu_\epsilon O_x \qquad (I)$$

wherein:

$\alpha$ is a number of from 1.4 to 2.0; $\beta$ is a number of from 0 to 0.6; $\gamma$ is a number of from 1.5 to 2.5; $\delta$ is a number of from 0 to 2.5; $\epsilon$ is a number of from 1.0 to 4.0; x is the stoichiometric value corresponding to the different oxides present.

11. Process according to claim 1, wherein said metal matrix comprises a metal selected from the group comprising: silver, silver alloys, copper, steel.

12. Process according to claim 11, wherein said metal matrix comprises two or more layers of said metals.

13. Process according to claim 1, wherein said multifilamentary conductive tape comprises 2 to 9 layers of said high-temperature superconducting material.

14. The process of claim 1 further comprising subjecting the multifilamentary tape obtained from step d) to at least one subsequent treatment step, wherein said at least one coupling step is carried out before said at least one subsequent treatment step.

15. The process of claim 14, wherein at least one subsequent treatment step comprises at least a second plastic deformation step.

16. Process according to claim 15, wherein said first and second plastic deformation steps are carried out by rolling and/or pressing.

17. The process of claim 14, wherein the at least one subsequent treatment step comprises at least a second sintering step.

18. The process of claim 14, wherein the at least one subsequent treatment step comprises at least a second plastic deformation step and at least a second sintering step.

19. The process of claim 1, wherein the at least first sintering step of said precursor causes mutual welding of the superconducting material.

20. The process of claim 1, wherein the at least first sintering step further comprises increasing the density of the crystalline structure of the superconducting material.

21. The process of claim 1, wherein the coupling step comprises subjecting the contacting tapes to a heated gas at a predetermined atmospheric condition.

22. The process of claim 1, wherein the multifilamentary tape has a length substantially greater than the thickness of the multifilamentary tape.

23. Process for producing a multifilamentary conductive tape of the type comprising a plurality of layers of a high-temperature superconducting material, incorporated in mutually spaced relationship within a metal matrix, said process comprising the steps of:

a) plastically deforming a plurality of metal tubes including a precursor of a superconducting material, said plastic deformation being carried out on each individual tube of the plurality of the tubes to obtain a corresponding plurality of elementary tapes, structurally independent from each other;

b) subjecting said elementary tapes to at least a first sintering treatment for promoting the formation of the superconducting material from said precursor;

c) placing a plurality of said elementary structurally independent tapes into contact with one another; and d) coupling said contacting elementary structurally independent tapes by subjecting the contacting elementary structurally independent tapes to at least one heating in a heated atmosphere, the temperature of the heating and the duration of the heating being sufficient to cause a stable mutual connection between said contacting elementary tapes.

24. The process of claim 23 further comprising:

performing at least a second plastic deformation step on the tapes with the sintered precursor therein to improve the orientation and densification of the sintered precursor, wherein said tape coupling step is performed separately from the at least second plastic deformation step.

25. The process of claim 24 further comprising:

performing at least a second sintering step on the sintered precursor which has been subjected to the second plastic deformation step.

26. The process of claim 23, wherein the coupling step is performed during a sintering step.

27. The process of claim 25, wherein the coupling step is performed during the first of the sintering steps which are performed.

28. The process of claim 25, wherein the coupling step is performed during the last of the sintering steps which are performed.

29. The process of claim 25, wherein the coupling step is performed intermediate one of the first and second sintering steps and one of the first and second plastic deformation steps.

30. The process of claim 23, wherein the temperature during the coupling step is between about 600° C. and 700° C.

31. Process for producing a multifilamentary conductive tape of the type comprising a plurality of layers of a high-temperature superconducting material, incorporated in mutually spaced relationship within a metal matrix, said process comprising the steps of:

a) at least a first plastic deformation step of a plurality of metal tubes including a precursor of a superconducting material, said plastic deformation being carried out on each individual tube of the plurality of the tubes to obtain a corresponding plurality of elementary tapes, structurally independent from one another;

b) at least a first sintering step of said precursor for promoting the formation of the superconducting material from said precursor; and c) performing a tape coupling step by stacking a plurality of said elementary, structurally independent tapes with the faces of the adjacent tapes in contact and coupling the tapes to each other with a coupling which prevents separation or sliding of the elementary tapes with respect to each other in subsequent operations performed on the stacked and coupled tapes, the coupling being produced by subjecting the structurally independent stacked tapes to a heated atmosphere and the temperature of heating and the time duration of the heating being sufficient to couple adjacent tapes to each other.

32. The process of claim 31 further comprising:

performing at least a second plastic deformation step on the tapes with the sintered precursor therein to improve the orientation and densification of the sintered precursor, wherein said tape coupling step is performed separately from the at least second plastic deformation step.

33. The process of claim 32 further comprising:

performing at least a second sintering step on the sintered precursor which has been subjected to the second plastic deformation step.

34. The process of claim 31, wherein the coupling step is performed during a sintering step.

35. The process of claim 33, wherein the coupling step is performed during the first of the sintering steps which are performed.

36. The process of claim 33, wherein the coupling step is performed during the last of the sintering steps which are performed.

37. The process of claim 33, wherein the coupling step is performed intermediate one of the first and second sintering steps and one of the first and second plastic deformation steps.

38. The process of claim 31, wherein the temperature during the coupling step is between about 600° C. and 700° C.

* * * * *